United States Patent
Oertel

[11] Patent Number: 5,862,039
[45] Date of Patent: Jan. 19, 1999

[54] COIL ELEMENT FOR A DATA CARRIER WITH AN INTEGRATED CIRCUIT AND NONCONTACTING COUPLING

[75] Inventor: Achim Oertel, Rosenheim, Germany

[73] Assignee: Giesecke & Devrient GmbH, Munich, Germany

[21] Appl. No.: 694,821

[22] Filed: Aug. 9, 1996

[30] Foreign Application Priority Data

Aug. 11, 1995 [DE] Germany ............ 195 29 640

[51] Int. Cl.⁶ ............... H05K 1/14; H05K 7/02
[52] U.S. Cl. ............ 361/737; 361/760; 361/807; 235/493
[58] Field of Search ............... 361/737, 748, 361/760, 761, 764, 728, 733, 767, 807, 779, 808, 809, 811, 821; 235/488, 487, 492, 493, 380, 382; 340/825.33, 825.32

[56] References Cited

U.S. PATENT DOCUMENTS

| 4,868,373 | 9/1989 | Opheij et al. | 235/380 |
|---|---|---|---|
| 4,960,983 | 10/1990 | Inoue | 235/449 |
| 4,999,742 | 3/1991 | Stampfli | 361/782 |
| 5,399,847 | 3/1995 | Droz | 235/488 |
| 5,412,192 | 5/1995 | Hoss | 235/380 |
| 5,424,527 | 6/1995 | Takahira | 235/492 |
| 5,606,488 | 2/1997 | Gustafson | 361/782 |

FOREIGN PATENT DOCUMENTS

| 0 481 776 A2 | 4/1992 | European Pat. Off. . |
|---|---|---|
| 0 640 949 A2 | 3/1995 | European Pat. Off. . |
| 44 16 697 | 11/1995 | Germany . |

Primary Examiner—Dean A. Reichard
Assistant Examiner—Anthony Dinkins
Attorney, Agent, or Firm—Bacon & Thomas

[57] ABSTRACT

The invention relates to a coil element for a data carrier with an integrated circuit and noncontacting coupling and to a method for producing it. The coil element includes a carrier film or layer (6) and a wire-wound coil (2) fixed to the carrier layer (6). The carrier layer (6) serves to mechanically stabilize the wire-wound coil (2) and becomes part of the card body during production of the data carrier, for example an IC card. The coil (2) is fixed to the carrier film (6) during the winding process or directly following the winding process. The winding process and the apparatus used therefor are designed so that a plurality of coils (2) can be wound and fixed on a common carrier layer (6) simultaneously.

18 Claims, 3 Drawing Sheets

COIL ELEMENT FOR A DATA CARRIER WITH AN INTEGRATED CIRCUIT AND NONCONTACTING COUPLING

BACKGROUND OF THE INVENTION

A) Field of the Invention

This invention relates to a coil element for a data carrier with an integrated circuit and noncontacting coupling, in particular an IC card, and a method for producing such a coil element.

B) Related Technology

IC cards are used in different areas of application, for example as telephone cards, credit cards, check cards, identity cards, etc.

An IC card generally has a contact array or bank for coupling an IC embedded in the card with an external data processing apparatus. For this purpose the data processing apparatus has a counterpart to the IC card contact array which can be electrically connected with the contact array when required.

IC cards are also known which have a coil instead of the contact array or in addition to the contact array. This coil permits contactless data and energy transfer between the IC card and the data processing apparatus by means of electromagnetic radiation. The coil is embedded in the card body during production of the IC card. Various methods are known for equipping an IC card with a coil.

It is known from U.S. 4,999,742 to bond a wound wire coil onto a substrate and then cover it with a cover film or layer. Since the wire coils generally consist of very thin wire and only few turns, these wire coils are very difficult to handle and to place exactly on the substrate. The wire coils readily bend or deform during transport from the coil manufacturer to the card manufacturer and must therefore be elaborately packaged. Furthermore it is very difficult to position and bond the sensitive wire coils on the substrate by machine. Manual positioning and bonding is possible, but relatively expensive.

It is furthermore known from DE 44 16 697 to produce a coil in the form of a very thin metal layer on a substrate. This substrate can be integrated in a card body to produce a contactless IC card. However the production of such metal layer coils is relatively expensive and there is the danger of the metal layer being interrupted by breaking upon application of mechanical stress on the card.

The invention has an objective permitting cost-effective and largely automated production of data carriers with integrated circuits and noncontacting coupling which meet high quality requirements.

BRIEF SUMMARY OF THE INVENTION

The basic principle of the invention is to produce data carriers for contactless operation using, not loose wire-wound coils, but coil elements wherein a wire-wound coil is fastened to a carrier for mechanically stabilizing the coil, for example a film or substrate, to be referred to as the carrier film or layer in the following description. During production of the coil elements the coils are wound directly on the carrier film as a base, with a winding core that is removable after the winding process, giving the coil the desired form. The ends of the wire-wound coil elements optionally can be connected to an IC. The coil elements can be either individually produced and further processed into data carriers, or be in the form of a multiple-copy sheet having a plurality of wire-wound coils on a common carrier film or layer. The transition from multiple-copy to single processing is fundamentally possible at each method step during production of the data carrier, i.e. the data carrier can be produced completely in multiple-copy production and separated from the multiple-copy sheet at the end, or in single production from the beginning, or one can start out with multiple-copy production and divide up the multiple-copy sheet during the production process and continue with single production. For producing a multiple-copy sheet consisting of a plurality of wire-wound coils fastened to a common carrier layer one simultaneously winds a plurality of coils and fastens them to the carrier layer.

The invention has the advantage that it permits efficient and cost-effective production of IC cards or similar data carriers for contactless operation, since it dispenses with the difficult handling of the sensitive wire coils and the elaborate positioning of the wire coils on a substrate. A further advantage of the invention is that it permits multiple-copy production of the coil elements, thereby making the production process more efficient. Furthermore the invention has the advantage that the coil can be positioned very precisely in the card body. Exact positioning of the coil is important in particular if the card body is subsequently provided with embossings, since one must then make sure that no wire turns extend into the embossing area. Otherwise the embossing quality would be impaired and there would be the danger of the turns being interrupted by the embossing.

DESCRIPTION OF THE DRAWINGS

The invention will be explained in the following with reference to the embodiments shown in the figures, in which.

DETAILED DESCRIPTION OF THE PREFERRED EMBODIMENT

Figure 1:
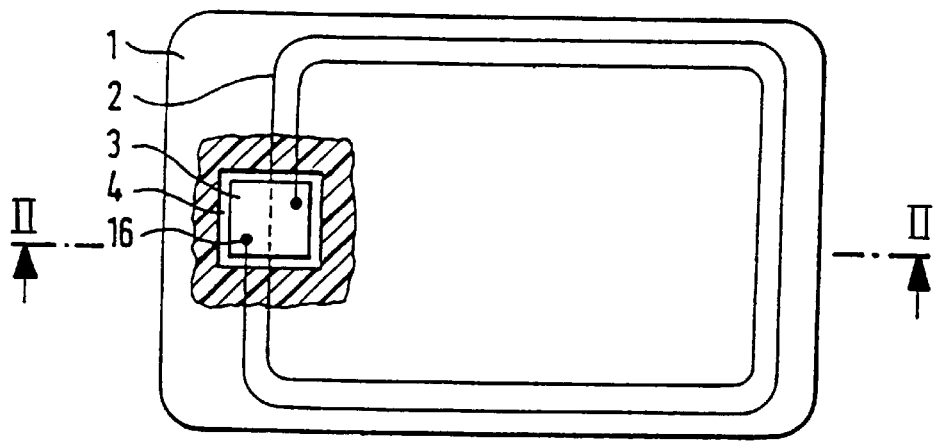
FIG. 1 shows an IC card in a plan view.

FIG. 1 shows an IC card as an example of a data carrier for contactless operation in a frontal or plan view. The dimensions of card body 1 can be fixed according to ISO standard 7810. Card body 1 contains wire-wound coil 2 and chip module 3 which is disposed in gap 4. The IC card may be a telephone card, identity card, check card, credit card or the like. Chip module 3 contains an IC not explicitly shown in FIG. 1 which is electroconductively connected with contact surfaces 16 of chip module 3. Contact surfaces 16 are furthermore connected with the two ends of wire-wound coil 2. Depending on the application, different data can be stored in the IC. Via wire-wound coil 2, data can be exchanged with an external data processing device. The data transmission between the IC card and the external data processing device takes place by means of electromagnetic radiation. The power supply to the IC card is generally ensured by the electromagnetic radiation emitted by the external data processing device.

Figure 2:
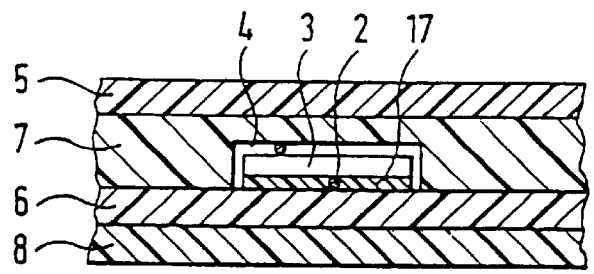
FIG. 2 shows a sectional view of the IC card taken along line II—II in FIG. 1.

FIG. 2 shows an enlarged detail of a section through the IC card shown in FIG. 1 along line II—II. This section shows the layer structure of card body 1. Card body I has upper cover film or layer 5 and lower cover film or layer 8. Under upper cover film 5 there is substrate film 7 which has gap 4 for receiving chip module 3. Substrate film 7 is followed by a coil element comprising carrier film 6 and wire-wound coil 2. Furthermore the card body contains chip module 3 fixed on the coil element with casting or potting compound 17. The ends of the wires of coil 2 are guided over chip module 3 to contact surfaces 16 for electrical connection.

The structure of the card body depicted in FIG. 2 shows only one of many possibilities. Cover films 5 and 8 can thus be omitted, for example, or further films can be added. The number and order of the films or layers used, their thickness and the material used can vary. Further it is also possible to produce card body 1 by injection molding. For this purpose the coil element can be placed in an injection mold and provided with injection molding compound either on one side or on both sides.

Figure 3:
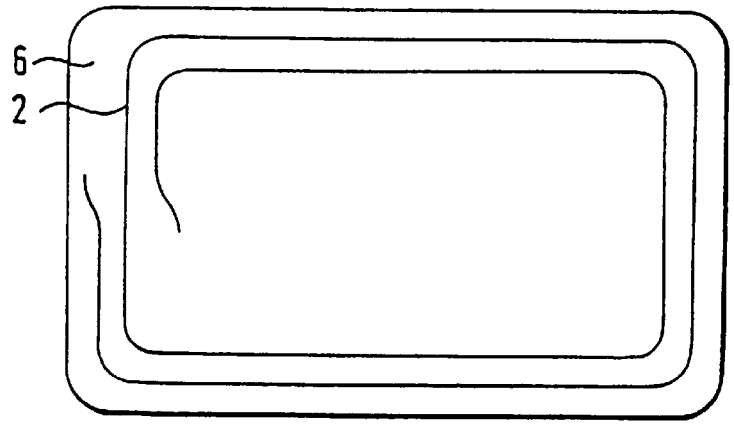
FIG. 3 shows a coil element consisting of a carrier film and a wire-wound coil fastened thereto.

FIG. 3 shows a coil element comprising carrier film 6 and wire-wound coil 2 fixed thereto. Coil 2 can be fixed to carrier film 6 by means of an adhesive which is activable for example thermally or by pressure. This fixation protects sensitive coil 2 against unintentional deformation. The coil element has higher mechanical stability than a loose coil and also a greater working surface, so that the coil element is easier to handle by machine than a loose coil.

Figure 4:
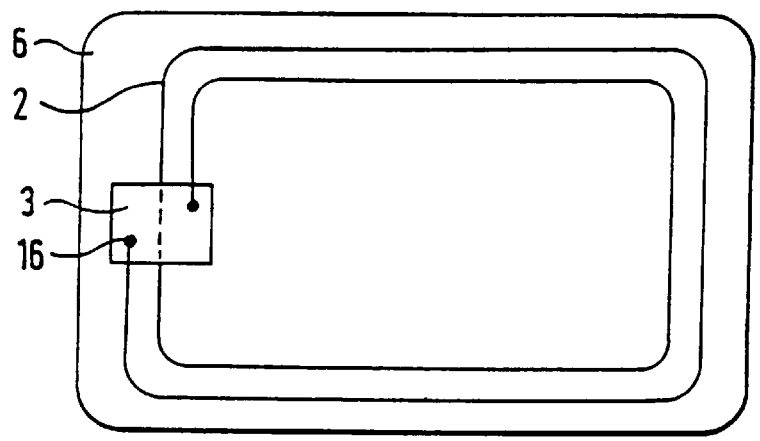
FIG. 4 shows a coil element having an IC in addition to the carrier film and wire-wound coil.

FIG. 4 shows a coil element which is provided with chip module 3 in addition to carrier film 6 and wire-wound coil 2. Chip module 3 can be disposed over coil 2, as shown in FIG. 4, the wire ends of coil 2 being drawn up to contact surfaces 16 of chip module 3 and connected with coil 2 and/or carrier film 6 by means of a suitable adhesive. Alternatively to the embodiment shown in FIG. 4, chip module 3 could also be mounted between coil 2 and carrier film 6 or on the back of carrier film 6. In the latter case, contacting between chip module 3 and the coil can take place through bores in carrier film 6. The structure of chip module 3 is known in the art. Chip module 3 contains an integrated circuit connected via bonding wires with at least two contact surfaces 16 of chip module 3. Contact surfaces 16 of chip module 3 are furthermore connected with the ends of wire-wound coil 2. The coil element depicted in FIG. 4 is already in principle a fully operative IC card. Laminating on further layers or spraying on further material as further optional processing steps during production of an IC card from the coil element serve mainly to obtain the desired outer dimensions of the IC card, ensure sufficient mechanical durability, fulfill the security requirements to be met by the card, and give the card an appealing appearance.

Figure 5:
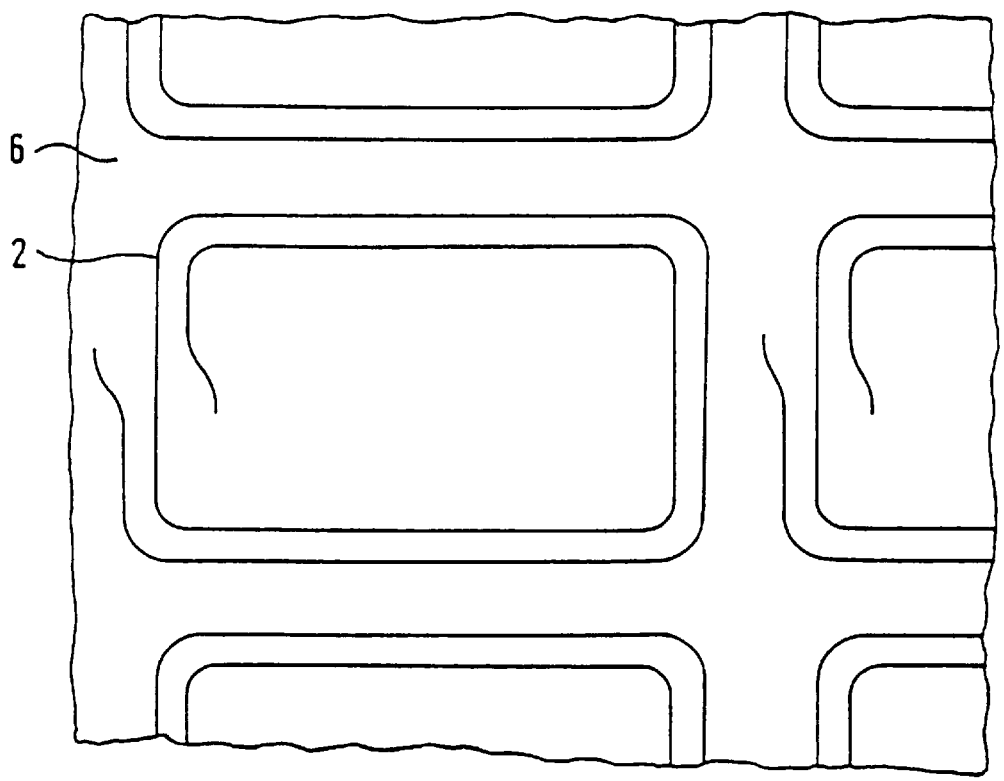
FIG. 5 shows a multiple-copy sheet consisting or a plurality of wire-wound coils fastened to a common carrier film.

FIG. 5 shows a multiple-copy sheet with a plurality of wire-wound coils 2 disposed on common carrier film or layer 6. Depending on the embodiment the multiple-copy sheet contains coil elements according to FIG. 3 or according to FIG. 4. As will be explained below in detail, a plurality of coil elements are manufactured simultaneously during production of the multiple-copy sheet. In one embodiment of the invention the further processing of the multiple-copy sheet consisting of a plurality of coil elements into finished IC cards takes place continuously in multiple-copy production. In this embodiment the further processing steps are thus also performed on the complete sheet and the individual IC cards separated from the sheet only at the end of the production process. This permits the production process to be very efficient, since each step processes a plurality of pieces simultaneously.

However it may also be more advantageous to perform one or more processing steps not on the multiple-copy sheet but on individual pieces. One should accordingly divide the multiple-copy sheet into individual pieces before these processing steps. To permit most efficient production of the IC card one should thus first analyze the production process as to which processing steps can be performed better on a multiple-copy sheet and which processing steps can be performed better on single pieces. Depending on the result of analysis one then fixes the production step at which one passes from multiple-copy to single piece production.

Figure 6:
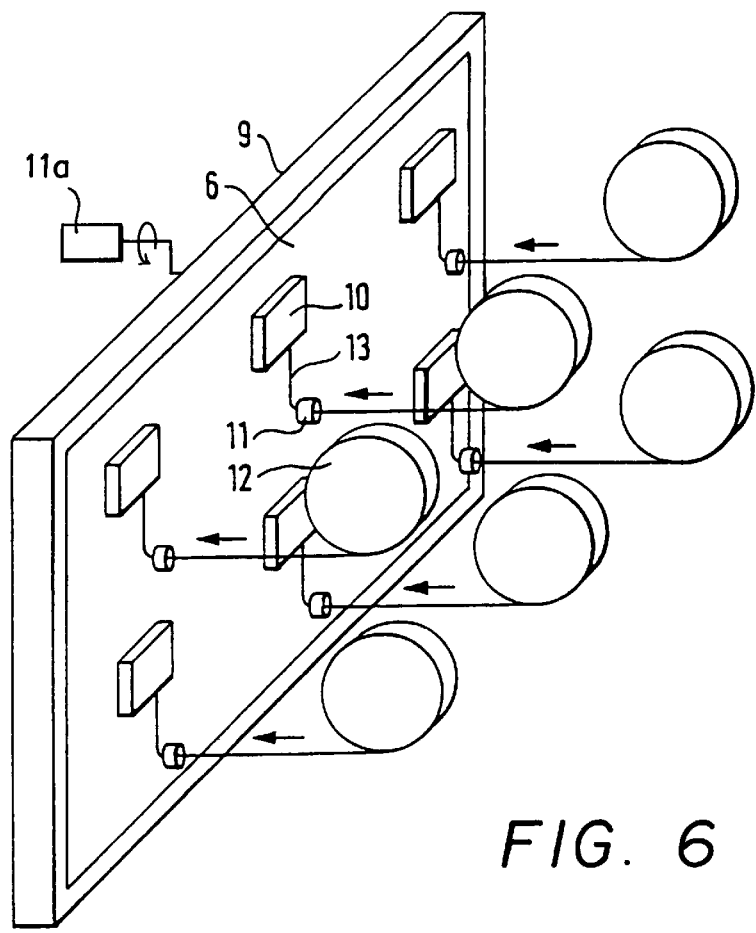
FIG. 6 shows an apparatus for producing the multiple-copy sheet shown in FIG. 5.

FIG. 6 shows an apparatus for producing multiple-copy sheets from coil elements. Carrier film or layer 6 is applied to receiving plate 9. Attachment of the carrier film to receiving plate 9 can be caused for example by producing a vacuum between carrier film 6 and receiving plate 9. Winding cores 10 are removably fastened to the places on carrier film 6 where wire-wound coils 2 are to be disposed. Winding cores 10 for example are held in position by means of a magnetic field produced by receiving plate 9. This manner of holding avoids damage to carrier film 6 and leaves enough room for winding coils 2. During winding of coils 2 wires 13 are fed to winding cores 10 from supply rolls 12 via wire guides 11. The winding process takes place jointly for all winding cores 10 through an eccentric motion of receiving plate 9. Alternatively to eccentric motion of receiving plate 9, wire guides 11 could also be moved accordingly to achieve winding motion relative to plate 9.

Figure 7:
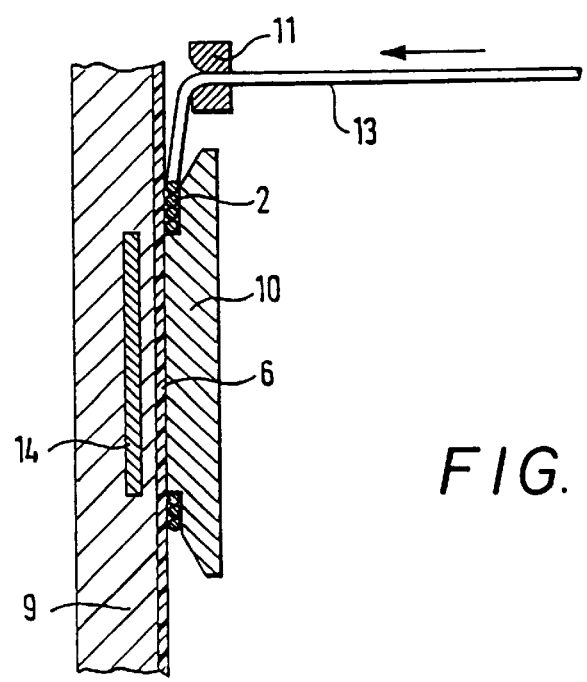
FIG. 7 shows a detail sectional view of the winding apparatus shown in FIG. 6.

FIG. 7 depicts an enlarged sectional detail of the winding apparatus shown in FIG. 6 in cross section. FIG. 7 depicts one of the winding cores 10 which is urged by means of electromagnet 14 disposed in receiving plate 9 against carrier film 6 lying on receiving plate 9. Winding core 10 is shaped so as to form together with carrier film 6 lying on receiving plate 9 a ring-shaped gap as a support into which wire 13 can be wound.

Wire 13 is fed to the ring-shaped gap by means of wire guide 11. During the winding process wire guide 11 is guided around the ring-shaped gap, or the ring-shaped gap is guided around wire guide 11 in corresponding fashion by an eccentric motion of receiving plate 9 relative to the wire guide 11 caused, for example, by drive device 11a. In both cases wire-wound coil 2 is formed progressively in the ring-shaped gap.

The production of a multiple-copy sheet with the apparatus depicted in FIGS. 6 and 7 takes place as follows.

Carrier film 6 is placed on receiving plate 9 and fixed by application of a vacuum between carrier film 6 and the surface of receiving plate 9. The vacuum can be produced by pumping out air through channels in receiving plate 9 not shown in the drawing. Winding cores 10 are disposed at the desired positions on carrier film 6 with a positioning device. The positioning device can contain for example grip arms (not shown) for receiving winding cores 10. However winding cores 10 can also be held on the positioning device by a vacuum or by means of electromagnets. As soon as winding cores 10 are positioned on carrier film 6 they are fixed on the carrier film 6 by activation of electromagnet 14 located in receiving plate 9. Wires 13 are then brought near winding cores 10 by means of wire guides 11 and the wire ends threaded into winding cores 10 by known methods.

By an eccentric motion between receiving plate 9 and wire guides 11, wires 13 are wound around winding cores 10 so that wire-wound coils 2 are progressively formed in the ring-shaped gaps between winding cores 10 and carrier film 6 lying on receiving plate 9. The winding process is performed with an eccentric (i.e., orbital) motion since rotation of receiving plate 9 would lead to a tangling of wires 13 and thus would be unsuitable for multiple-copy production. In the preferred embodiment the eccentric motion takes place by motion of receiving plate 9. Alternatively, however, it is also possible to move wire guides 11 in corresponding fashion. For lasting fixation of coils 2, wires 13 can be provided with a fixing compound which interconnects the individual turns of coils 2 and fixes coils 2 on carrier film 6. The fixing compound can also be applied to carrier film 6, however, at the places where coils 2 are positioned. The fixing compound can be applied in the area of coils 2 either all over or only in part. The hardening of the fixing compound can be promoted by pressure, ultrasound, temperature increase or irradiation with ultraviolet light. A temperature increase can be produced for example by an electric current flowing through coils 2.

After the end of the winding process wires 13 are severed and winding cores 10 removed from carrier film 6 so that wire-wound coils 2 remain on the carrier film. Removal of winding cores 10 is facilitated if they are provided with a non-adherent or nonstick coating, for example Teflon, which prevents the fixing compound from sticking to the winding cores. After elimination of the vacuum between receiving plate 9 and carrier film 6, carrier film 6 including wire-wound coils 2 fixed thereto can be removed from receiving plate 9 and fed to further processing. This further processing can either be performed on the multiple-copy sheet formed by the carrier film and coils 2 located thereon, or this multiple-copy sheet can be divided into individual coil elements each consisting of wire-wound coil 2 and a piece of carrier film 6.

In a development of the invention the apparatus shown in FIGS. 6 and 7 serves further to equip the coil elements with one chip module 3 each. For this purpose a gap is provided in each winding core 10 for receiving chip module 3. Furthermore each winding core 10 has wire guiding devices into which the ends of the wires of coil 2 can be inserted and thus fed to contact surfaces 16 provided on chip module 3 and connected electroconductively therewith.

In a modification of the invention coils 2 are not already applied to carrier film 6 during the winding process, but first wound completely on winding cores 10 and then transferred to carrier film 6. The transfer takes place directly from winding cores 10 to carrier film 6, so that no handling of loose coils 2 is necessary. In this embodiment winding cores 10 can be somewhat modified in their shape to prevent the turns from sliding off winding cores 10, or sliding can be prevented in a different way, for example by a detachable catch.

I claim:

1. A coil element for a data carrier with an integrated circuit and noncontacting coupling, wherein the coil element comprises a wire-wound coil (2) and a coil carrier layer (6) for mechanical stabilization of the coil (2), the coil (2) being substantially completely wound and mounted on the coil carrier layer (6) separate from any data carrier and fastened to the coil carrier layer (6) during the winding process or directly after the winding process separate from any data carrier.

2. The coil element of claim 1, wherein the coil carrier layer (6) comprises a film.

3. The coil element of claim 1, wherein the coil element includes a chip module (3).

4. A method for producing coil elements for a data carrier with an integrated circuit and noncontacting coupling, comprising the steps of winding at least one coil (2) substantially in its entirety on a carrier layer (6) separate from any data carrier for mechanical stabilization of the entire coil (2) and fastening the coil to the carrier layer (6) during the winding process or directly after the winding process separate from any data carrier.

5. The method of claim 4, including fastening the carrier layer (6) detachably to a receiving plate (9) and positioning at least one winding body (10) on the carrier layer (6).

6. The method of claim 5, including fastening the carrier layer (6) detachably to the receiving plate (9) by application of a vacuum between the carrier layer (6) and the receiving plate (9).

7. The method of claim 5, including holding the winding body or bodies (10) by a magnetic field produced by the receiving plate (9).

8. The method of claim 5, including bringing a wire (13) near each winding body (10) by means of a wire guide (11), and winding a coil (2) onto each winding body (10) by eccentric motion of the receiving plate (9) relative to the wire guides (11).

9. The method of claim 5, including removing the winding bodies (10) from the carrier layer (6) after the end of the winding process, and with the wire-wound coils (2) remaining on the carrier layer (6).

10. The method of claim 5, including fastening the wire-wound coils (2) to the carrier layer (6) by a fixing compound (17) which is applied to the carrier layer (6) before the winding process or is fed to the wires (13) during the winding process.

11. The method of claim 5, including electrically connecting the wire ends of each wire-wound coil (2) with a chip module (3).

12. An apparatus for producing coil elements for data carriers with integrated circuits and noncontacting coupling, comprising a receiving plate (9) for receiving a carrier layer (6) for mechanical stabilization of wire-wound coils (2), at least one winding core (10) for winding the coils (2), at least one wire guide (11) for bringing a wire (13) near the winding core (10), and a device that produces an eccentric motion of the receiving plate (9) relative to the wire guide (11).

13. The apparatus of claim 12, wherein each winding core (10) includes at least in the area onto which said wire (13) is to be wound, a coating to which a fixing compound (17) for fastening the wire-wound coil (2) to the carrier layer (6) is substantially non-adherent.

14. The apparatus of claim 12, wherein each winding body (10) has gaps for receiving a chip module (3).

15. A multiple-copy sheet for producing data carriers with integrated circuits and noncontacting coupling, the multiple-copy sheet comprising a carrier layer (6) having wire-wound coils (2) disposed thereon, which wire wound coils are wound on the carrier layer (6) and fastened substantially in their entirety to the carrier layer (6) during the winding process or directly after the winding process.

16. A data carrier including multiple data carrier layers, an integrated circuit and a non-contacting data coupling, said data coupling including a coil element comprising a wire-wound coil (2) and a coil carrier layer (6) for mechanical stabilization of the coil (2), the coil (2) being wound, mounted and fastened substantially in its entirety on the coil carrier layer (6) separately from the data carrier layers, before it is associated with the data carrier.

17. The data carrier of claim 16 wherein said coil element constitutes one of the layers of said multiple data carrier layers and said coil (2) is wound, mounted and fastened substantially in its entirety on the coil carrier layer (6) separately from the non-coil element layers before it is associated with the data carrier.

18. The data carrier of claim 16, including injection molded material on at least one side of said coil element.

* * * * *